(12) United States Patent
Lapke et al.

(10) Patent No.: US 9,349,645 B2
(45) Date of Patent: May 24, 2016

(54) APPARATUS, DEVICE AND METHOD FOR WAFER DICING

(71) Applicant: NXP B.V., Eindhoven (NL)

(72) Inventors: Martin Lapke, Hamburg (DE);
Hartmut Buenning, Norderstedt (DE);
Sascha Moeller, Hamburg (DE); Guido Albermann, Hamburg (DE); Thomas Rohleder, Hamburg (DE); Heiko Backer, Hamburg (DE)

(73) Assignee: NXP B.V., Eindhoven (NL)

( * ) Notice: Subject to any disclaimer, the term of this patent is extended or adjusted under 35 U.S.C. 154(b) by 110 days.

(21) Appl. No.: 14/055,188

(22) Filed: Oct. 16, 2013

(65) Prior Publication Data

US 2015/0104931 A1 Apr. 16, 2015

(51) Int. Cl.
| | | |
|---|---|---|
| *H01L 21/00* | (2006.01) | |
| *H01L 21/78* | (2006.01) | |
| *B28D 5/00* | (2006.01) | |
| *B28D 1/22* | (2006.01) | |
| *H01L 21/683* | (2006.01) | |
| *H01L 21/30* | (2006.01) | |
| *H01L 21/46* | (2006.01) | |

(52) U.S. Cl.
CPC .............. *H01L 21/78* (2013.01); *B28D 1/221* (2013.01); *B28D 5/0041* (2013.01); *H01L 21/6836* (2013.01); *H01L 2221/6834* (2013.01); *H01L 2221/68327* (2013.01); *H01L 2221/68386* (2013.01); *Y10T 225/287* (2015.04); *Y10T 225/298* (2015.04)

(58) Field of Classification Search
None
See application file for complete search history.

(56) References Cited

U.S. PATENT DOCUMENTS

| | | | |
|---|---|---|---|
| 2002/0066726 A1 | 6/2002 | Cole, Sr. et al. | |
| 2005/0074952 A1* | 4/2005 | Miyamoto | H01L 21/67132 438/455 |
| 2005/0236378 A1* | 10/2005 | Boyle | B23K 26/0648 219/121.67 |
| 2007/0275543 A1* | 11/2007 | Abe | H01L 21/78 438/464 |
| 2010/0301496 A1* | 12/2010 | Koduri | H01L 23/492 257/777 |
| 2011/0085150 A1* | 4/2011 | Ichinose | G03F 7/7075 355/67 |

OTHER PUBLICATIONS

"TLS-Dicing—A new Wafer Dicing Technology for Higher Yield and Throughput", Jenoptik, 21 pgs retrieved from the internet at: www.eu-ru.info/index.../ERSTC2009_Session1_Jenoptik_Zuehlke.pdf (Jun. 2009).
"Wafer Dicing Machines", Accretech, 2 pgs, retrieved from the internet Oct. 15, 2013 at: http://www.accretech.jp/english/semicon/product/c/wafer_dm/.

* cited by examiner

*Primary Examiner* — Calvin Choi

(57) ABSTRACT

An apparatus, device and method for wafer dicing is disclosed. In one example, the apparatus discloses: a wafer holding device having a first temperature; a die separation bar moveably coupled to the wafer holding device; and a cooling device coupled to the apparatus and having a second temperature which enables the die separation bar to fracture an attachment material in response to movement with respect to the wafer holding device. In another example, the method discloses: receiving a wafer having an attachment material applied to one side of the wafer; placing the wafer in a holding device having a first temperature; urging a die separation bar toward the wafer; and cooling the attachment material to a second temperature, which is lower than the first temperature, until the attachment material fractures in response to the urging.

13 Claims, 14 Drawing Sheets

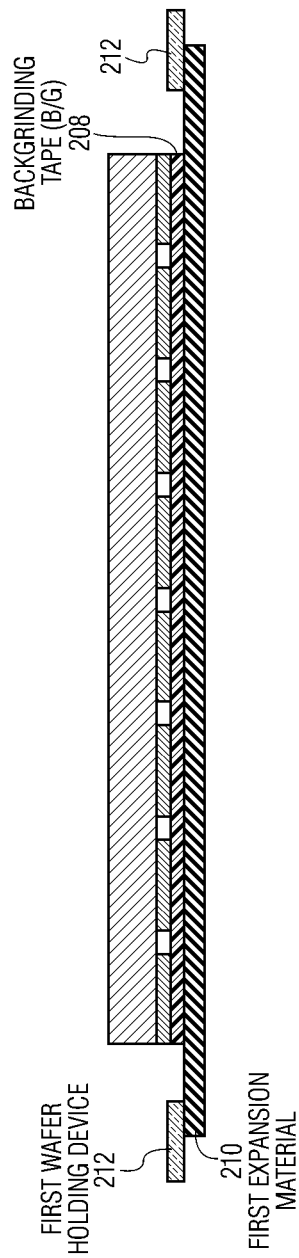

APPARATUS, DEVICE AND METHOD FOR WAFER DICING

BACKGROUND

Brief Background Introduction

This specification relates generally to systems and methods for wafer dicing. There are many steps to wafer dicing and managing them efficiently and at low cost is a challenge. Further improvements are desired.

BRIEF DESCRIPTION OF THE DRAWINGS

FIGS. 2A and 2B are examples of a first and a second wafer processing steps;

DETAILED DESCRIPTION

Semiconductor wafer pre-assembly usually occurs after full wafer fabrication. During this pre-assembly the wafer has to be separated in single chips in a dicing step. One possibility, besides normal blade dicing, is stealth laser dicing where a sawlane between two die can be reduced to 15 µm instead of 50 µm to 80 µm sawlane widths associated with blade dicing. Stealth laser often works by initiating a hair-crack within the wafer material which then enables the dies to cleave cleanly as underlying dicing tape or foil is stretched to separate the dies from one another during an expansion processing step. The dicing foil is connected to the wafer frame (FFC) and is expandable so that individually separated dies can be picked up. Expansion allows the dies to be picked up so they do not damage each other.

More details of "stealth dicing" may be found in U.S. patent application Ser. No. 13/687,110 of Sascha Moeller and Martin Lapke titled, "Wafer Separation" filed on Nov. 28, 2012 and is incorporated by reference in its entirety.

With such a reduced sawlane width, a number of Potential Good Dies Per Wafer (PGDW) can be significantly increased, especially when small dies are being fabricated. Laser dicing can also improve fracture strength, enhance fabrication speed, and reduced chipping on the front and back sides of a wafer to a minimum.

Special fabrication applications require a wafer's backside to be coated with an attachment material (e.g. Die Attach Film (DAF)). Die attach films have become an important technology to realize excellent reliability, high performance, and high speed in a packaging process, as well as to enable smaller and thinner semiconductor packages.

DAF can be thought of as a type of attaching material, adhesive, glue, etc. DAF is typically an organic material while the wafer is substantially a crystalline material. DAF backed dies at small sizes and having small lane width dimensions between dies is increasingly required by customers. However, because DAF is a soft organic, glue-like type of material, stealth laser dicing typically can not cut the DAF cleanly if at all. As a result should the underlying dicing tape or foil be stretched, the dies will stick to one another in semi-random ways, preventing the dies from being picked up individually, and reducing the yield of a wafer or requiring that the entire wafer be discarded.

Figure 1:
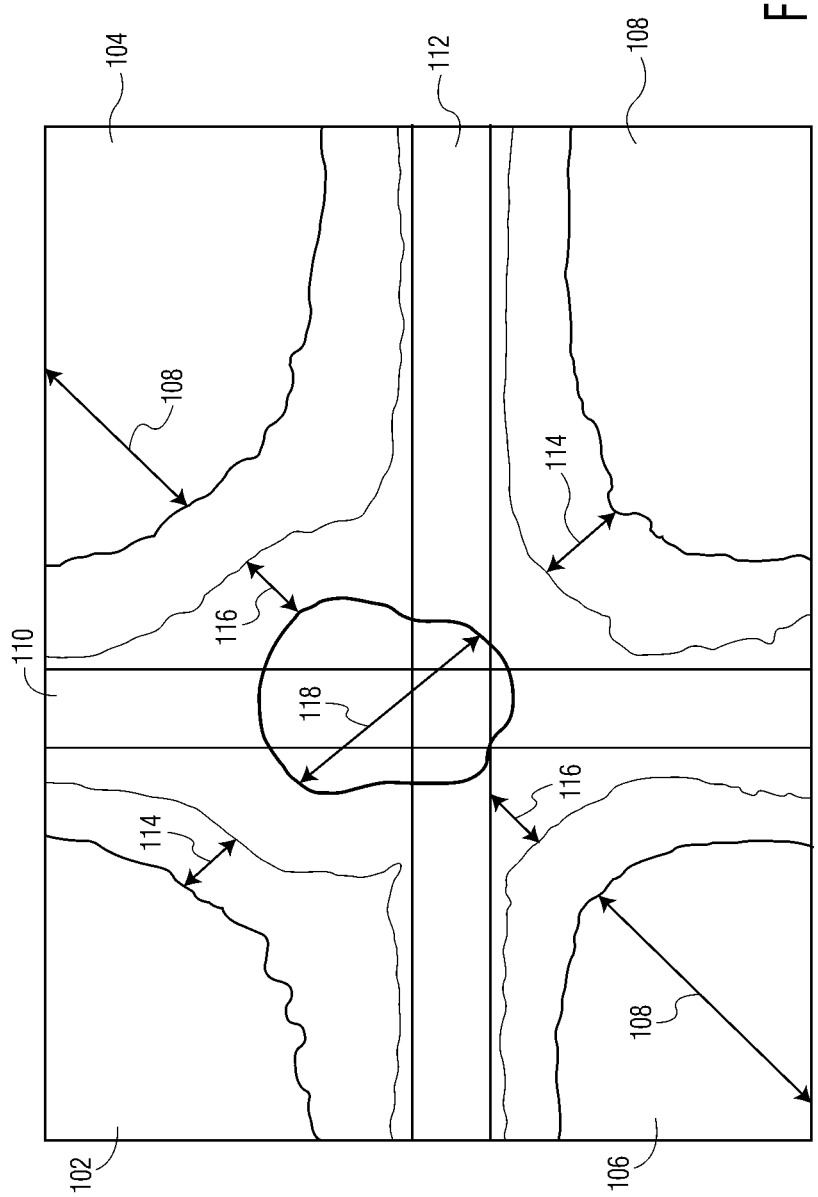
FIG. 1 is an example of damage incurred during wafer dicing.

FIG. 1 is an example of damage which can be incurred during wafer dicing of DAF coated wafers. FIG. 1 shows four dies 102, 104, 106, 108 which have been laser diced and expanded, resulting in two perpendicular sawlanes 110 and 112. Expansion has created several problems in the DAF coating, including a partially detached DAF region 114, a fully detached DAF region 116, and a DAF hole region 118. Note that the DAF still connects the four dies 102, 104, 106, 108 except in the hole 118 region. An attached DAF region 105 connected to dies 104 and 106 is also shown.

Thus when expansion occurs before the DAF can be broken, then the DAF will typically only semi-detach, as shown in FIG. 1. As discussed above, such semi-detachment occurs because of DAF flexibility, stretchiness, and/or elasticity which prevents ready separation.

In response to the concerns discussed above, additional example embodiments are now discussed. In these new embodiments, DAF coated wafers can be readily separated after laser dicing. A number of potential good dies per wafer (PGDW) with an attach material coating (e.g. DAF) can be increased significantly by reducing the saw lane up to a minimal width of 15 µm while cleanly cutting the attach material. These example embodiments extend DAF advantages to smaller dies and also allow a reduced saw lane width to increase the number of PGDW. Such embodiments enable attach material, such as DAF, to be applied to very thin dies and products that can't be diced by a blade dicing process.

Example cooling processes are used to make an attachment material more rigid and brittle, enabling easier separation after dicing. Such cooling can be applied in either a global manner, using for example a cooling cushion, or a local manner, using for example a cooled die separation bar. Global cooling in one example embodiment is a cooling cushion or in another example embodiment is a cooling liquid applied to a side of a wafer which is typically opposite to a wafer holding chuck and/or a die separation bar. Local cooling example embodiment is a cooled separation bar.

Some processes separating laser diced DAF coated wafers held in a cooled wafer holding chuck use just expansion. Since the wafer holding chuck holds a back-side of a wafer, active die separation using a die separation bar on the back-side of the wafer is prevented. This is because the die separation bar moves under a back-side of the wafer where the expansion foil is and where a cooling chuck would be placed. Processes using a cooling chuck tend not to be feasible for rectangular dies whose top surface dimensions are less than 2 mm×2 mm.

Details of the present claimed device/service are now discussed.

Figure 2A:
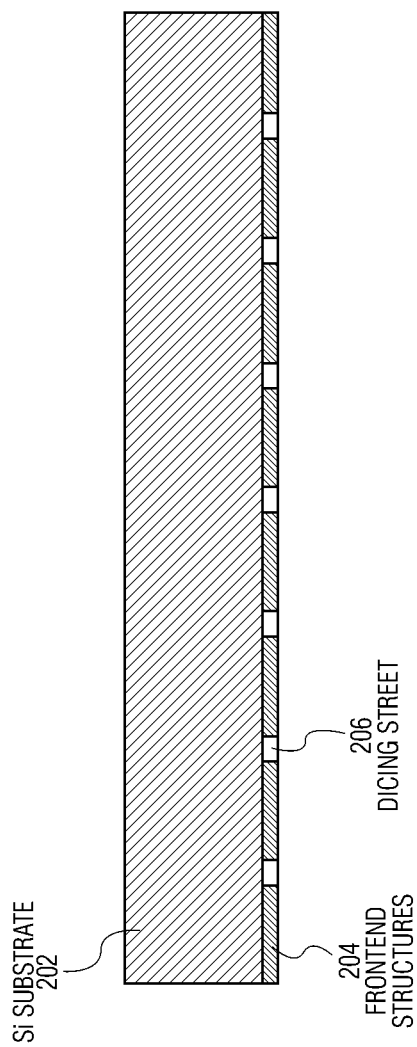

FIGS. 2A and 2B are examples of a first and a second wafer processing steps. Example substrate materials can be composed in part of at least one from a group including: glass, alumina, silicon, gallium arsenide, silicon on sapphire, ceramics, plastic, a crystalline material, and other semiconductor or crystalline materials. Shown is a Silicon (Si) substrate 202 upon which are frontend structures 204 such as electronic circuits separated by a dicing street 206.

A backgrinding tape 208 is applied to the frontend structures 204 surface. A first expansion material 210 (e.g. dicing/expansion tape/foil) is applied to the backgrinding tape 208. The first expansion material 210 is mounted to a first wafer holding device 212. In one example the first wafer holding device 212 is a film frame carrier (FFC) which has an 8" diameter. In other example embodiments, the first wafer holding device 212 may have many other smaller or larger sizes appropriate for holding a wafer. Such other sizes include: 4", 6", 12", 300 mm, as well as others. The substrate 202 is ground to desired thickness.

Figure 3A:
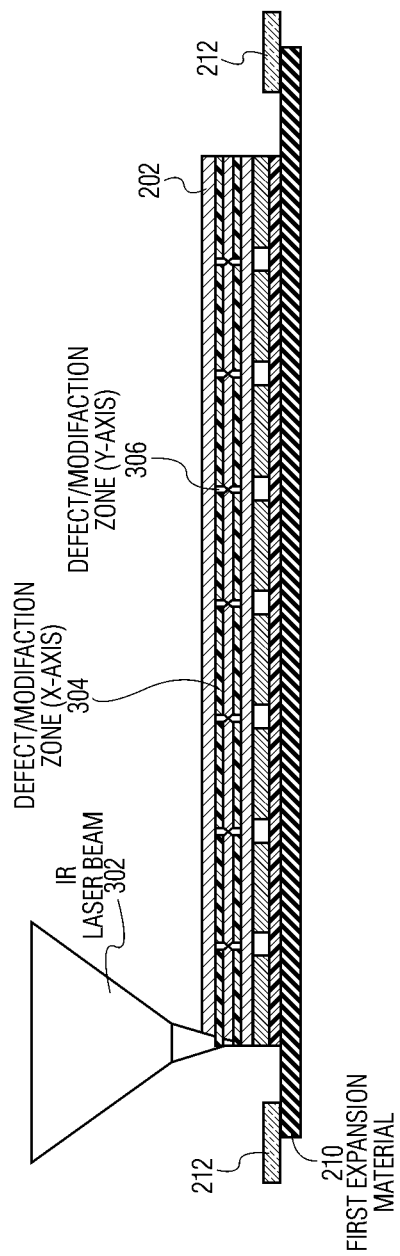
FIGS. 3A and 3B are examples of a third and a fourth wafer processing steps.
Figure 3B:
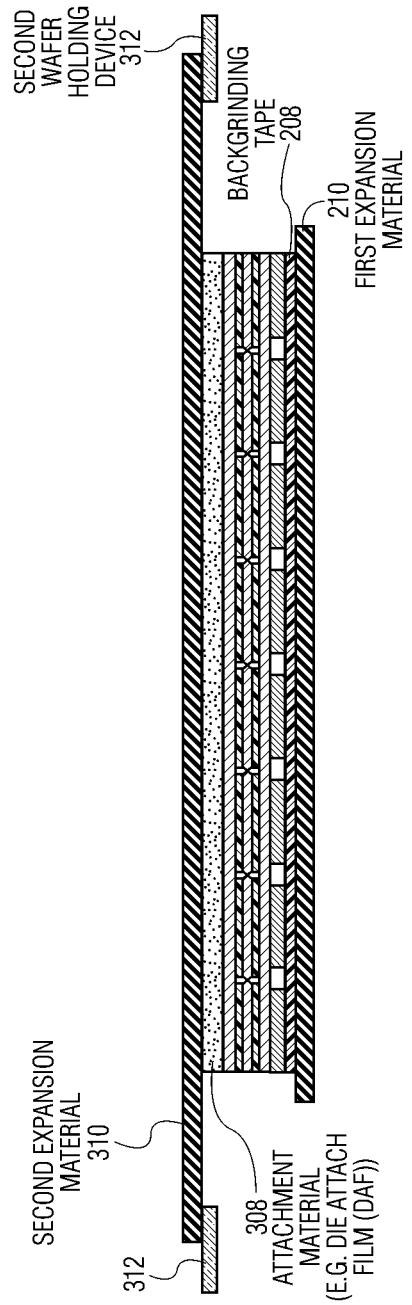

FIGS. 3A and 3B are examples of a third and a fourth wafer processing steps. The wafer substrate 202 is diced by a laser from the back-side of the wafer. The laser 302 creates defects in the substrate 202 (e.g. defect/modification zone x-axis 304 and defect/modification zone y-axis 306) which provides stress regions which can be fractured (e.g. cracked, cleaved, etc.) during subsequent steps. The normal definition of "fracture" is herein augmented to include a crack in the substrate 202 and/or an attachment material 308 (discussed below) sufficient to enable a first selected die or a first set of dies to be picked up and/or separated from a second die or second set of dies created on the wafer substrate, without sticking to or otherwise disturbing the second die or second set of dies.

An attachment material 308 is then applied to the backside of the substrate 202. The attachment material 308 can be at least one from a group including: a die attach film (DAF), an adhesive, an attractive coating, a UV activated material, and other structures or materials which provide attachment properties. A second expansion material 310 (e.g. dicing/expansion tape/foil) is mounted to the attachment material 308 on the wafer substrate's 202 backside. A second wafer holding device 312 is mounted to the second expansion material 310. In one example the second wafer holding device 312 is a 12" film frame carrier. In other example embodiments, the second wafer holding device 312 may have many other smaller or larger sizes appropriate for holding a wafer. Such other sizes include: 4", 6", 8", 300 mm, as well as others.

The wafer substrate 202 is then flipped (see FIG. 3B to FIG. 4A orientation change) and the first expansion material 210 and backgrinding tape 208 are peeled off.

Once the wafer has been fractured by a laser, or other process, as discussed in FIG. 3, the attachment material 308 (e.g. the DAF tape) is now cooled so that it can become brittle and fracture (i.e. crack, break, cleave, or separate) with little or no damage to the attachment material 308 during expansion. In an example embodiment, cooling causes the attachment material 308 to be embrittled and crack under stress. FIGS. 4, 5, and 6 present example embodiments of fifth and sixth processing steps for fracturing the attachment material 308 prior to, or during, expansion. These example embodiments are global cooling, local cooling, and a combined global and local cooling.

Figure 4A:
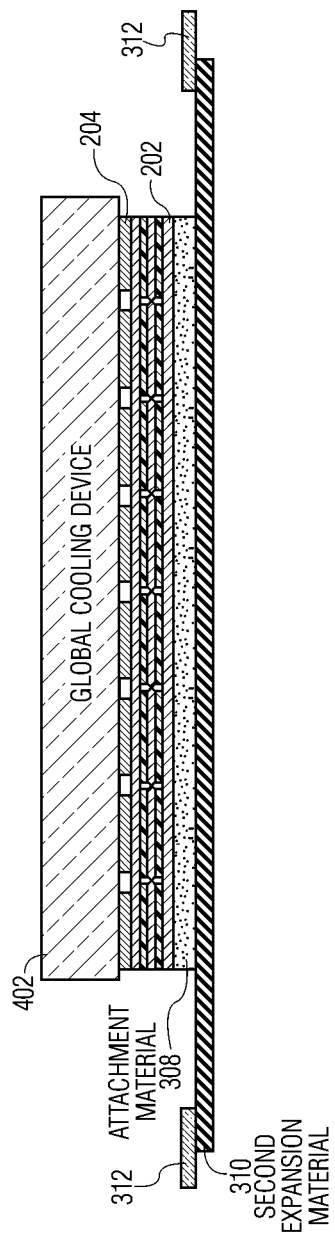
FIGS. 4A and 4B are examples of a fifth and a sixth wafer processing steps using global cooling.
Figure 4B:
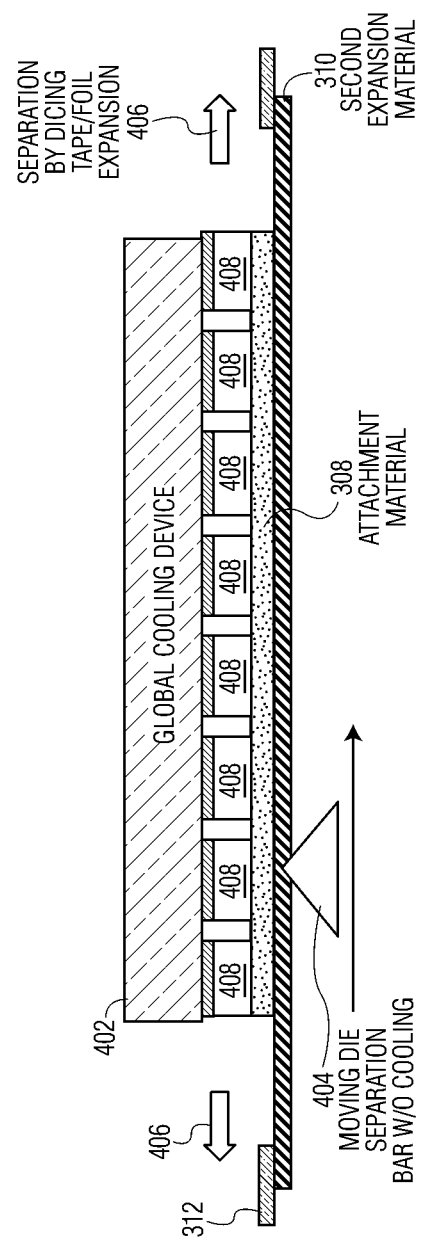

FIGS. 4A and 4B are examples of a fifth and a sixth wafer processing steps using global cooling. A global cooling device 402 is applied to either or all of the substrate 202, the frontend structures 204 or attachment material 308. Example embodiments of the global cooling device 402 include: a cooling cushion, a cooling liquid, or another environmental condition which causes at least the attachment material 308 to cool from a first temperature to a second temperature. The first temperature is herein defined as a temperature insufficient to allow the attachment material 308 to fracture. An augmented definition of fracture was presented earlier. The second temperature is herein defined as a temperature sufficient to allow the attachment material 308 to fracture, as defined above.

In one example, shown in FIG. 4A, the attachment material 308 is cooled from the top side of the wafer, perhaps while in an expansion device. Depending upon a particular wafer fabrication, cooling could take place in other wafer fabrication devices as well. In the FIG. 4A example the global cooling device 402 is a cooling cushion filled with a liquid that can be cooled down to a temperature sufficient to enable the attachment material 308 to fracture so that the dies on the wafer can separate during an expansion step, discussed in FIG. 7. The cooling cushion would come into contact with the wafer so that the attachment material 308 could be cooled to the second temperature. Alternately, a cooling liquid can be coupled to cool the wafer by spraying the liquid directly on the wafer. The liquid itself can be cooled or evaporation of the liquid from the wafer can cool the attachment material 308 to the second temperature.

In one example embodiment the second temperature is about zero degrees Celsius. However, in other examples on production lines operating at higher speed, a −5 to −10 degrees Celsius is possible. Other wafer fabrication processes and attachment materials 308 may require different temperatures. The liquid in the cooling cushion in one example process can be isopropanol. Other example cooling liquids include: liquid nitrogen, Fluorinert™, propylene glycol, other organic solvents, and super-cool gas.

While in one example embodiment stretching of the second expansion material 310 thereby separating the wafer dies (see FIG. 7) can be done right after or during cooling of the attachment material 308, FIG. 4B shows an example embodiment where a die separation bar 404 is positioned on a side of the substrate 202 opposite to the global cooling device 402 and proximate to or under the defect/modification zones 304 and 306.

The die separation bar 404 is moveably coupled to the wafer holding device 312 such that a portion of the substrate 202 can then be bent over the die separation bar 404 to fracture the attachment material 308 and create a set of dies 408. In one example, the fracturing occurs by positioning the die separation bar 404 under a selected sub-set of the substrate's 202 defect/modification zones 304 and 306 and urging the die separation bar 404 toward the substrate 202 such that the substrate 202 and attachment material 308 fractures.

Figure 7:
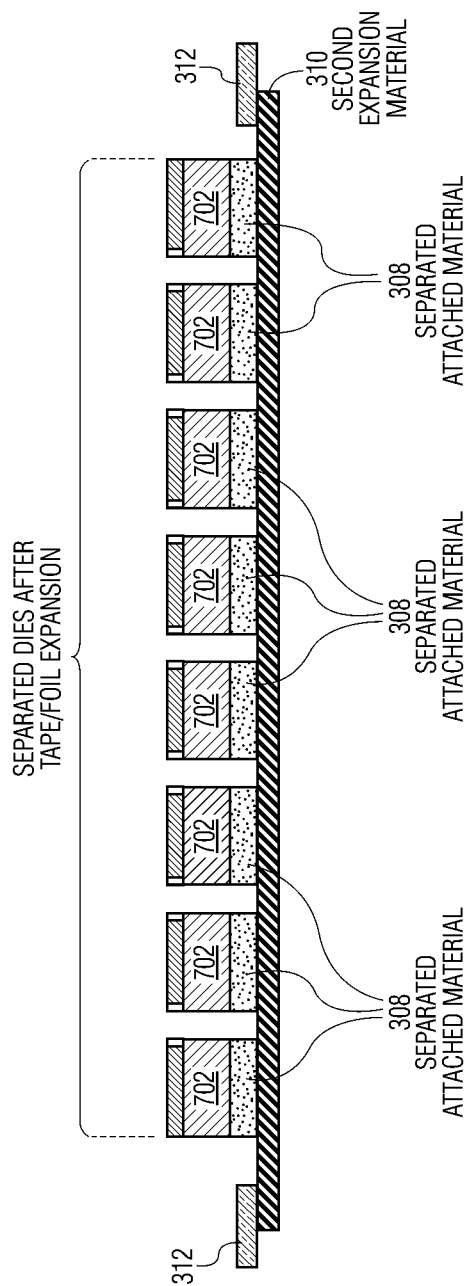
FIG. 7 is an example of a seventh wafer processing step.

After the die separation bar 404 fractures the attachment material 308, the second expansion material 310 is stretched 406 thereby creating separated dies 702 as shown in FIG. 7. Use of the die separation bar 404 in conjunction with global cooling enables thin and/or small dies having attachment material 308 to properly break with less damage to the attachment material 308.

Figure 5A:
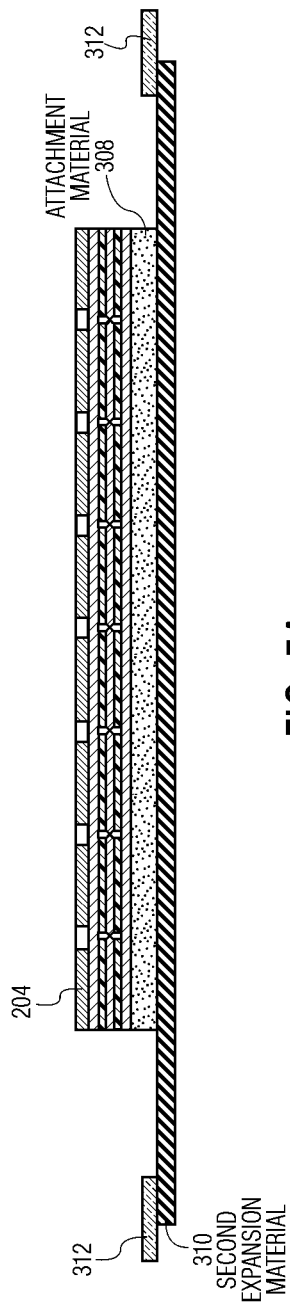
FIGS. 5A and 5B are examples of the fifth and the sixth wafer processing steps using local cooling.
Figure 5B:
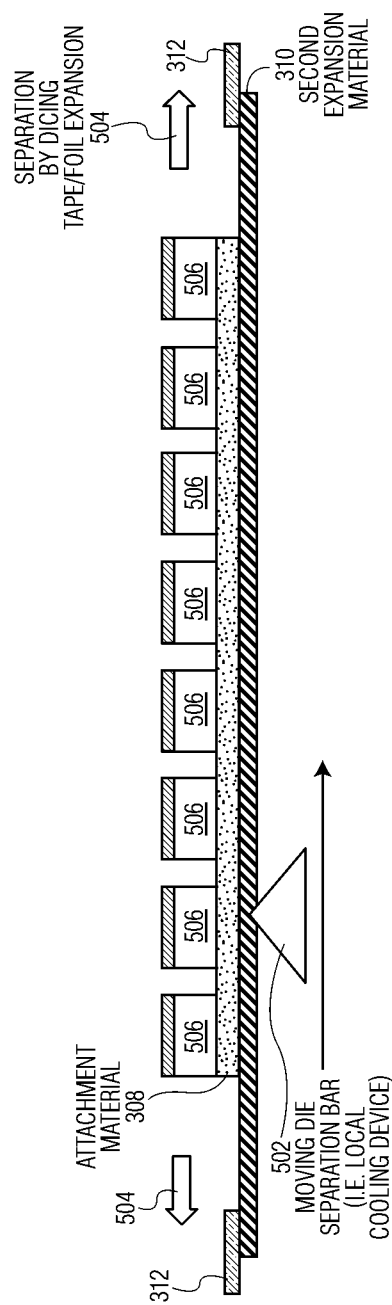

FIGS. 5A and 5B are examples of the fifth and the sixth wafer processing steps using local cooling. In FIG. 5A, the attachment material 308 is locally cooled using a cooled die separation bar 502, which causes at least the attachment material 308 to cool from a first temperature to a second temperature, which is sufficient to fracture the attachment material 308.

In the FIG. 5A example, the wafer assembly, including the substrate 202 and attachment material 308, is received after the FIG. 3 laser dicing step. FIG. 5B shows an example embodiment where the cooled die separation bar 502 is positioned on a side of attachment material 308 opposite to (e.g. under) the substrate 202 and proximate to or under the defect/modification zones 304 and 306.

Depending upon the particular wafer fabrication process used, the cooled die separation bar 502 is held under each defect/modification zone 304 or 306 such that he attachment material 308 is sufficiently cooled (e.g. to zero degrees Celsius as discussed above). The substrate 202 is then bent over the cooled die separation bar 502 to fracture the attachment material 308 under all or a selected sub-set of the substrate's 202 defect/modification zones 304 and 306 thereby fracturing the attachment material 308 and creating a set of dies 506. After the cooled die separation bar 502 fractures the attachment material 308, the second expansion material 310 is stretched 504 thereby creating separated dies 702 as shown in FIG. 7. Use of the cooled die separation bar 502 enables thin and/or small dies having attachment material 308 to properly break with less damage to the attachment material 308.

Figure 6A:
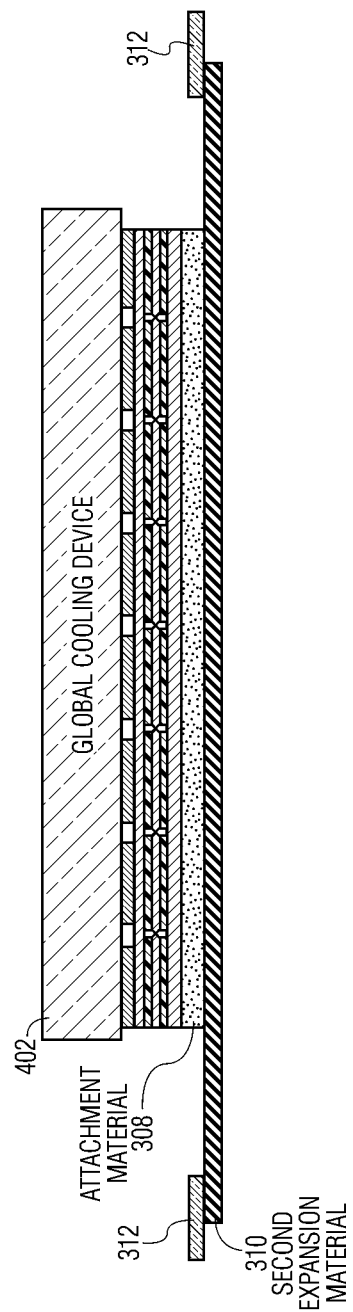
FIGS. 6A and 6B are examples of the fifth and the sixth wafer processing steps using global and local cooling.
Figure 6B:
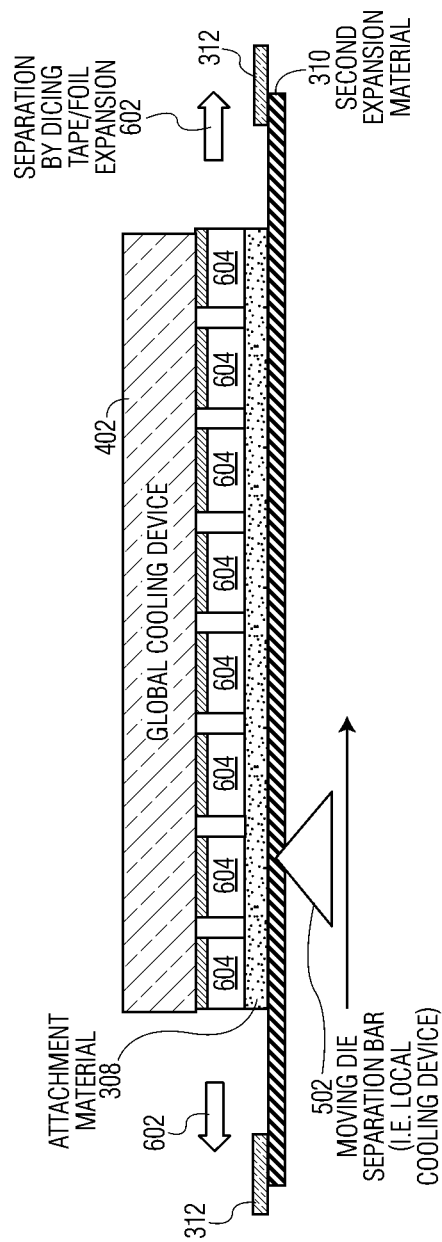

FIGS. 6A and 6B are examples of the fifth and the sixth wafer processing steps using both global and local cooling. In FIG. 6A, the global cooling device 402 is applied as discussed in FIG. 4A and the cooled die separation bar 502 is applied as discussed in FIG. 5B to create a set of dies 604. Depending upon the particular wafer fabrication process used, application of both the global and local cooling can be modulated such that various production criteria are optimized, including die fabrication speed, die yield, thermal gradient minimization, reduced energy consumption, as well as others. After the cooled die separation bar 502 fractures the attachment material 308, the second expansion material 310 is stretched 602 thereby creating separated dies 702 as shown in FIG. 7.

Figure 8:
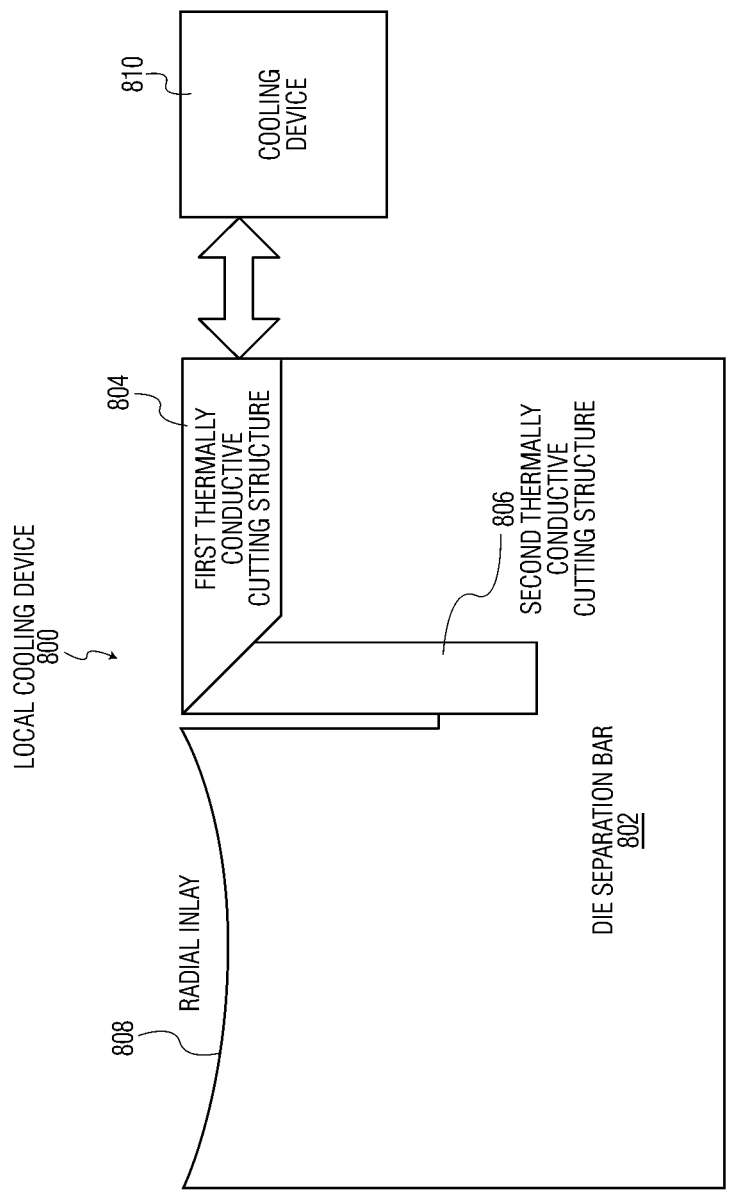
FIG. 8 is an example of a cooled die separation bar for local cooling.

FIG. 8 is an example embodiment of a local cooling device 800 for locally cooling the attachment material 308. The local cooling device 800 includes a die separation bar which FIG. 8 shows in a cross-sectional, edge-on view. The die separation bar 802 forms a core structure upon which a first thermally conductive cutting structure 804 and second thermally conductive cutting structure 806 are attached. The die separation bar 802 includes a radial inlay 808 such that when the first and second cutting structures 804 and 806 are placed proximate to the defect/modification zones 304 and 306, the substrate 202 can be bent to fracture the attachment material 308.

In various example embodiments, a cooling device 810 is thermally coupled to at least one of either the die separation bar 802, the first cutting structure 804 or the second cutting structure 806, thereby cooling the die separation bar 802 for implementing local cooling as discussed in FIGS. 5 and 6. The cooling device 810 can take various embodiments, including a thermoelectric cooling device using thermoelectric cooling (using the Peltier effect), a liquid nitrogen based cooling device, as well as others.

Selection of the cutting structures 804 and 806 in some example embodiments impacts the thermal, production time, and energy efficiency associated with fracturing the attachment material 308.

Figure 9:
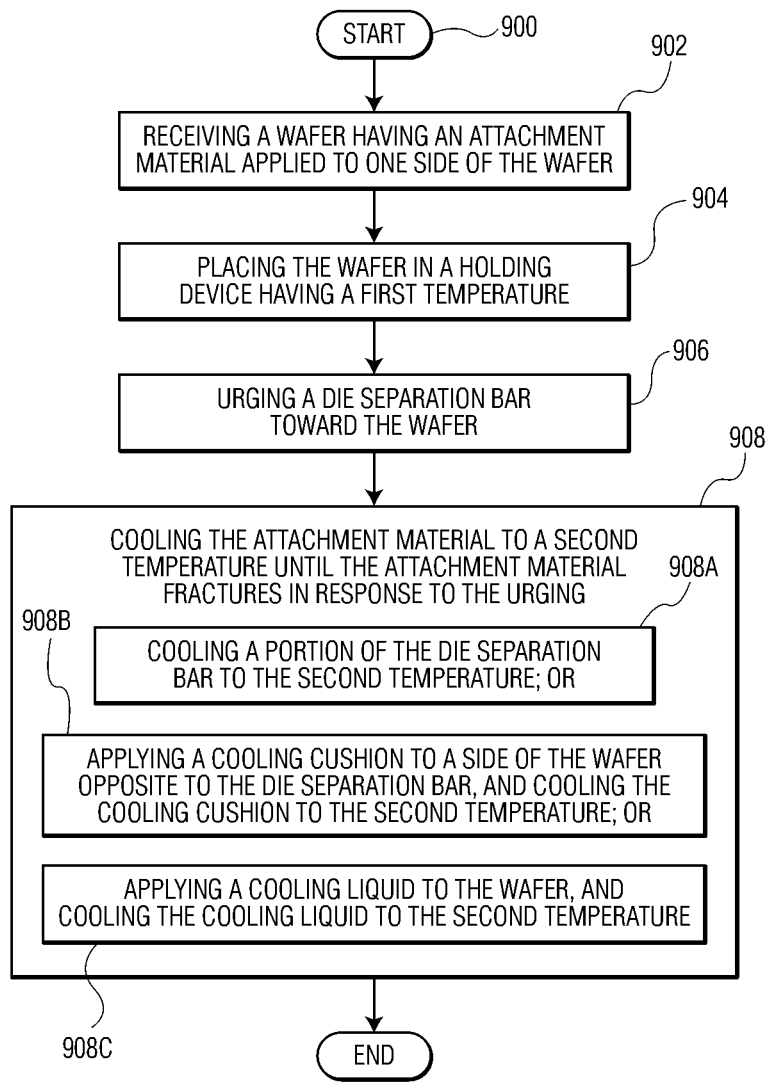
FIG. 9 is one example of a flowchart for implementing a method for wafer dicing.

FIG. 9 is one example of a flowchart for implementing a method 900 for wafer dicing. The method 900 begins in block 902, by receiving a wafer having an attachment material applied to one side of the wafer. Next, in block 904, placing the wafer in a holding device having a first temperature. In block 906, urging a die separation bar toward the wafer. Then in block 908, cooling the attachment material to a second temperature, which is lower than the first temperature, until the attachment material fractures in response to the urging.

Three example embodiments for implementing Block 908 are shown. In block 908A, cooling a portion of the die separation bar to the second temperature until the attachment material fractures in response to the urging. In block 908B, applying a cooling cushion to a side of the wafer opposite to the die separation bar; and cooling the cooling cushion to the second temperature until the attachment material fractures in response to the urging. In block 908C, applying a cooling liquid to the wafer; and cooling the cooling liquid to the second temperature until the attachment material fractures in response to the urging. Blocks 908A, 908B, and 908C may also be implemented together, in any combination.

The blocks comprising the flowcharts in the above Figures can be effected in any order, unless a specific order is explicitly stated. Also, those skilled in the art will recognize that while one example method embodiment is now discussed, the material in this specification can be combined in a variety of ways to yield other examples as well. The method just discussed is to be understood within a context provided by this and other portions of this detailed description.

Any functional and software instructions described above are typically embodied as a set of executable instructions which are effected on a computer which is programmed with and controlled by said executable instructions. Such instructions are loaded for execution on a processor (such as one or more CPUs). The processor includes microprocessors, microcontrollers, processor modules or subsystems (including one or more microprocessors or microcontrollers), or other control or computing devices. A processor can refer to a single component or to plural components.

In one example, one or more blocks or steps discussed herein are automated. In other words, apparatus, systems, and methods occur automatically. The terms automated or automatically (and like variations thereof) mean controlled operation of an apparatus, system, and/or process using computers and/or mechanical/electrical devices without the necessity of human intervention, observation, effort and/or decision.

In some examples, the methods illustrated herein and data and instructions associated therewith are stored in respective storage devices, which are implemented as one or more non-transient computer-readable or computer-usable storage media or mediums. The non-transient computer-usable media or mediums as defined herein excludes signals, but such media or mediums may be capable of receiving and processing information from signals and/or other transient media.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. An apparatus for wafer dicing, comprising:
a wafer holding device having a first temperature, the wafer holding device configured to hold a wafer that includes multiple dies;
a die separation bar moveably coupled to the wafer holding device such that a portion of the wafer can be bent over the die separation bar to fracture an attachment material and to create a set of separated dies; and
a cooling device coupled to the apparatus and having a second temperature which enables the die separation bar to fracture the attachment material in response to movement of the die separation bar with respect to the wafer holding device.

2. The apparatus of claim 1, wherein the cooling device sets the die separation bar to the second temperature.

3. The apparatus of claim 1, wherein:
the die separation bar is coupled to a thermally conductive cutting structure; and
the cooling device sets the thermally conductive cutting structure to the second temperature.

4. The apparatus of claim 1, wherein:
the cooling device includes a cooling cushion moveably coupled to the wafer holding device; and
the cooling device sets the cooling cushion to the second temperature.

5. The apparatus of claim 4, wherein:
the wafer holding device includes a wafer holding chuck for holding a first side of the wafer; and
the cooling cushion is coupled to be applied to a side of the wafer opposite to the first side of the wafer.

6. The apparatus of claim 4, wherein:
the die separation bar coupled to be applied to a first side of the wafer; and
the cooling cushion is coupled to be applied to a side of the wafer opposite to the first side of the wafer.

7. The apparatus of claim 1, wherein:
the cooling device includes a cooling liquid coupled to the wafer holding device; and
the cooling device sets the cooling liquid to the second temperature.

8. The apparatus of claim 1, wherein the attachment material is a die attach film (DAF).

9. The apparatus of claim 1, wherein the attachment material covers a stealth laser induced wafer defect zone between 15 μm and 100 μm wide.

10. The apparatus of claim 1, wherein the movable coupling between the die separation bar and the wafer holding device includes position increments of 2 mm or less.

11. The apparatus of claim 1, wherein the attachment material covers a wafer including at least one from a group consisting of: silicon, gallium arsenide, silicon on sapphire, ceramic, plastic, glass, and alumina.

12. The apparatus of claim 1, wherein the cooling device is at least one from a group consisting of: a thermoelectric cooling device and a liquid nitrogen based cooling device.

13. The apparatus of claim 1, wherein the wafer holding device is coupled to a die expansion device that is configured to stretch an underlying expansion material to separate dies from one another.

* * * * *